United States Patent
Shi et al.

(10) Patent No.: US 8,450,774 B2
(45) Date of Patent: May 28, 2013

(54) HIGH PERFORMANCE POWER SWITCH

(75) Inventors: Junxia Shi, Ithaca, NY (US); Lester Fuess Eastman, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 13/378,043

(22) PCT Filed: Jul. 12, 2010

(86) PCT No.: PCT/US2010/041648
§ 371 (c)(1),
(2), (4) Date: Dec. 13, 2011

(87) PCT Pub. No.: WO2011/008665
PCT Pub. Date: Jan. 20, 2011

(65) Prior Publication Data
US 2012/0097973 A1    Apr. 26, 2012

Related U.S. Application Data

(60) Provisional application No. 61/225,077, filed on Jul. 13, 2009.

(51) Int. Cl.
*H01L 31/102* (2006.01)
*H01L 29/66* (2006.01)
*H01L 31/06* (2006.01)
*H01L 29/12* (2006.01)
*H01L 29/20* (2006.01)

(52) U.S. Cl.
USPC ............. 257/189; 438/785; 257/76; 257/183; 257/187; 257/192; 257/201; 257/613; 257/615

(58) Field of Classification Search
USPC ................... 257/76, 129, 183, 187, 189, 192, 257/196, 201, 487, 615, 613, E21.371, E21.365; 438/785
See application file for complete search history.

(56) References Cited

U.S. PATENT DOCUMENTS

| | | |
|---|---|---|
| 2003/0104706 A1 | 6/2003 | Mitsuhashi et al. |
| 2004/0036086 A1* | 2/2004 | Khan et al. .................... 257/200 |
| 2006/0079034 A1 | 4/2006 | Hoffman et al. |
| 2006/0244035 A1 | 11/2006 | Bojarczuk et al. |
| 2006/0261516 A1 | 11/2006 | Kunitake et al. |
| 2007/0096104 A1 | 5/2007 | Tatsumi et al. |
| 2007/0252223 A1 | 11/2007 | Lee et al. |
| 2007/0278507 A1 | 12/2007 | Nakazawa et al. |
| 2008/0006845 A1* | 1/2008 | Derluyn et al. ................ 257/192 |
| 2008/0203430 A1* | 8/2008 | Simin et al. .................... 257/192 |

* cited by examiner

Primary Examiner — Julio J Maldonado
Assistant Examiner — Cory Eskridge
(74) Attorney, Agent, or Firm — MAXVALUEIP LLC

(57) ABSTRACT

In one example, we describe a new high performance AlGaN/GaN metal-insulator-semiconductor heterostructure field-effect transistor (MISHFET), which was fabricated using HfO2 as the surface passivation and gate insulator. The gate and drain leakage currents are drastically reduced to tens of nA, before breakdown. Without field plates, for 10 μm of gate-drain spacing, the off-state breakdown voltage is 1035V with a specific on-resistance of 0.9 mΩ-cm2. In addition, there is no current slump observed from the pulse measurements. This is the best performance reported on GaN-based, fast power-switching devices on sapphire, up to now, which efficiently combines excellent device forward, reverse, and switching characteristics. Other variations, features, and examples are also mentioned here.

16 Claims, 7 Drawing Sheets

HIGH PERFORMANCE POWER SWITCH

RELATED APPLICATIONS

This application is a continuation of and related to a provisional application filed in U.S. Ser. No. 61/225,077, filed 13 Jul. 2009, with the same title, and same assignee, Cornell University. The teachings and the entire specification of the provisional application are incorporated herein by reference, in its entirety. It also takes priority and takes benefit of the filing of (a continuation of) a PCT application SN PCT/US2010/041648, filed Jul. 12, 2010, with the same title, and same assignee, Cornell University. The teachings and the entire specification of the PCT application are also incorporated herein by reference, in its entirety.

GOVERNMENT FUNDING

This work is partially supported by US National Institute of Standards and Technology through its Advanced Technology Program, Agreement #70NANB7H7029.

BACKGROUND OF THE INVENTION

AlGaN/GaN heterostructure field-effect transistors (HFETs) have attracted much interest for high power and high frequency applications in recent years, because of their potentials for fast-switching with low-loss, high breakdown voltage (BV), high operating temperature, and good radiation hardness, among other reasons.

In power conditioning applications, switching at high frequency improves efficiency, and thus the device can also be used as an RF power amplifier in pulsed operations. However, the performance and reliability of AlGaN/GaN HFETs suffer from problems such as current slump and high gate and drain leakage currents, and these problems have to be solved in order to achieve practical applications.

Current slump may cause degradation of switching capabilities and increase in on-resistance. Passivation has been widely studied as a solution for suppressing current slump by encapsulating the surface states. However, while traditional passivation layers, such as Si3N4, can alleviate the current slump phenomena (see Ref. 1 below), they are not easily reproducible and tend to deteriorate the breakdown characteristics (see Refs. 2-3 below).

Other approaches, such as pre-passivation plasma treatments, annealing, and/or field-plates employments, can alleviate the current slump, as well (see Refs. 4-6 below), however, they tend to increase the on-resistance and/or create other problems.

For Schottky gates, the high leakage current precludes the realization of high breakdown voltage and incurs high power consumption, as well. There are many reports lately on the applications of insulators as gate dielectric and/or device passivation (see Refs. 7-9 below). While some can suppress the gate leakage current, they tend to induce current slump, lower the BV, or increase the on-resistance.

A solution for high-power fast switching devices, which can solve the entangled problems of current slump, persistent gate leakage, and premature breakdown, while maintaining a low on-resistance, is desirable.

There are a lot of references or prior art dealing with optimization of the material or devices related to power switches. For example, References 1-13, mentioned below: (These are also referred to throughout the current specification.)

1. B. M. Green, K. K. Chu, E. M. Chumbes, 1. A. Smart, 1. R. Shealy, L. F. Eastman, IEEE Electron Dev. Lett. 21, 268 (2000).
2. Y. Ando, Y. Okamoto, H. Miyamoto, N. Hayama, T. Nakayama, K. Kasahara, and M. Kuzuhara, IEDM Tech. Dig., 381 (2001).
3. H. Kim, R. M. Thompson, V. Tilak, T. R. Prunty, 1. R. Shealy, and L. F. Eastman, IEEE Electron Dev. Lett. 24, 421 (2003).
4. A. P. Edwards, 1. A. Mittereder, S. C. Binari, D. S. Katzer, D. F. Storm, and 1. A. Roussos, IEEE Electron Dev. Lett. 26, 225 (2005).
5. H. Kim, 1. Lee, D. Liu, and W. Lu, Appl. Phys. Lett. 86, 143505 (2005).
6. A. Brannick, N. A. Zakhleniuk, B. K. Ridley, 1. R. Shealy, W. 1. Schaff, and L. F. Eastman, IEEE Electron Dev. Lett. 30, 436 (2009).
7. C. Liu, E. F. Chor, and L. S. Tan, Semicond. Sci. Technol. 22, 522 (2007).
8. S. Yagi, M. Shimizu, M. Inada, Y. Yamamoto, G. Piao, H. Okumura, Y. Yano, N. Akutsu, H. Ohashi, Solid State Electron. 50, 1057 (2006).
9. A. Koudymov, N. Pala, V. Tokranov, S. Oktyabrsky, M. Gaevski, R. Jain, 1. Yang, X. Hu, M. Shur, R. Gaska, and G. Simin, IEEE Electron Dev. Lett. 30, 478 (2009).
10. M. A. Khan, G. Simin, 1. Yang, 1. Zhang, A. Koudymov, M. S. Shur, R. Gaska, X. Hu, and A. Tarakji, IEEE Trans. Microw. Theory Tech. 51, 624 (2003).
11. G. Simin, X. Hu, A. Tarakji, 1. Zhang, A. Koudymov, S. Saygi, 1. Yang, M. A. Khan, M. S. Shur, and R. Gaska, Jpn. 1. Appl. Phys. 40, L1142 (2001).
12. X. Hu, A. Koudymov, G. Simin, 1. Yang, M. A. Khan, A. Tarakji, M. S. Shur, and R. Gaska, Appl. Phys. Lett. 79,2832 (2001).
13. Y. C. Choi, 1. Shi, M. Pophristic, M. G. Spencer, and L. F. Eastman, 1. Vac. Sci. Technol. B 25, 1836 (2007).

However, here, we have introduced a new device, and a method for producing such a device, to optimize the performance further, with new features, as described in details below.

The inventors have based this invention partially based on the following paper: Titled "High Performance AlGaN/GaN Power Switch with HfO2 Insulation", authored by Junxia Shi and Lester F. Eastman (of School of Electrical and Computer Engineering, Cornell University, Ithaca, N.Y. 14853), plus Xiaobin Xin and Milan Pophristic (of Velox Semiconductor Corp., Somerset, N.J. 08873).

However, please note that all the inventions and inventive steps are done at Cornell University, by the 2 Cornell researchers, i.e. the current (and only) 2 inventors on the inventors list, for the current application.

SUMMARY OF THE INVENTION

In one embodiment, a high performance AlGaN/GaN metal-insulator-semiconductor heterostructure field-effect transistor (MISHFET) was fabricated using HfO2 (Hathium Dioxide) as the surface passivation and gate insulator. The gate and drain leakage currents are drastically reduced to tens of nA, before breakdown. Without field plates, for 10 μm of gate-drain spacing, the off-state breakdown voltage is 1035V with a specific on-resistance of 0.9 mΩ-cm2.

In addition, there is no current slump observed from the pulse measurements. This is the best performance reported on GaN-based, fast power-switching devices on sapphire, up to now, which efficiently combines excellent device forward, reverse, and switching characteristics.

DETAILED DESCRIPTION OF THE PREFERRED EMBODIMENTS

In one embodiment, we obtained the current slump-free HfO2 metal-insulator-semiconductor heterostructure field-effect transistors (MISHFETs) with a specific on-resistance (ARon) of 0.9 mΩ-cm2 and a BV of 1035V with 10 μm of gate-drain spacing, without any field-plate design. In addition, the gate/drain leakage current before the hard breakdown is as low as several tens of nA.

In one embodiment, the material structure started with 30 nm of AlN nucleation layer on a sapphire substrate, on top of which the AlGaN/GaN heterostructure, was grown by Metal-Organic Chemical Vapor Deposition (CVD). In some embodiments, different substrates may be used, for example, but not limited to, silicon carbide, silicon, sapphire, zinc oxide, quartz, fused silicon, silicon, ceramic substrate, or even free-standing GaN. In some embodiments, the epitaxial structure can be any III-nitride materials, such as, but not limited to, AlGaN/GaN (which was used in this example), InAlN/GaN, and AlN/GaN.

In between the AlGaN barrier and the GaN buffer, there was a 1 nm of AlN inter-barrier layer (the thickness can vary from 0.7 to 1.5 nm) to better confine carriers and minimize interface scattering. The buffer layer was optimized to enhance resistivity. While the barrier layer was 23 nm, with Al percentage of 27%, in this embodiment, the thickness of this barrier layer and Al percentage can vary in other embodiments. The structure was capped with 2 nm of GaN, to enhance the source and drain contact conductivity, and define an active region therebetween. Room temperature C-V measurement showed a carrier density of $9.3 \times 10^{12}$ cm-2 in the two-dimensional electron gas channel and the carrier concentration in the buffer was lower than $1 \times 10^{13}$ cm-3.

Figure 1:
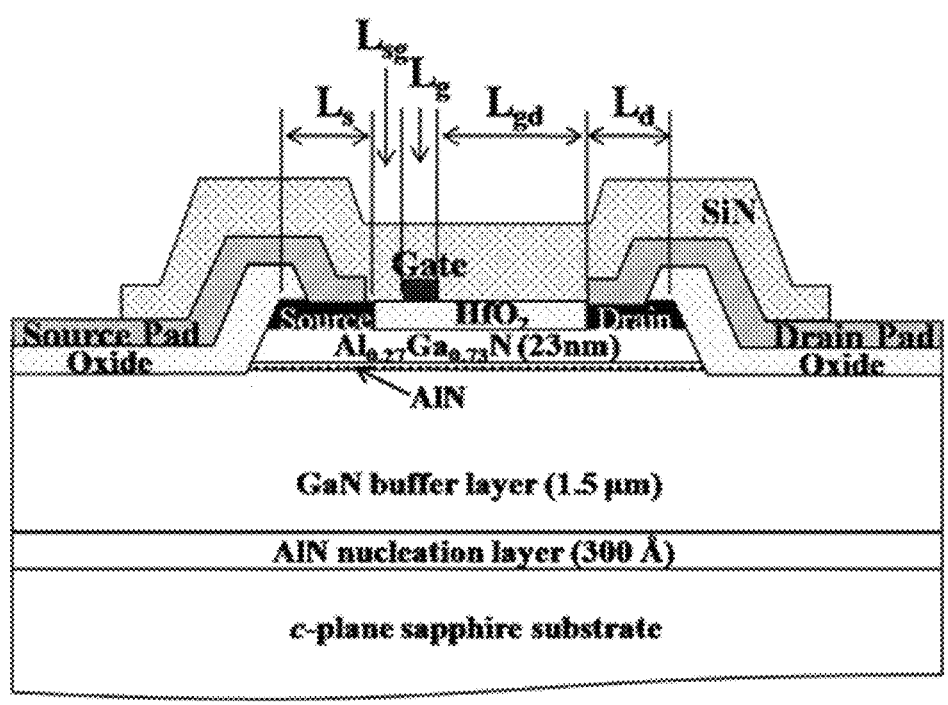
FIG. 1 shows a schematic cross-sectional view of the fabricated HfO2 AlGaN/GaN MISHFETs. (Ls/Ld: source/drain ohmic contact length, Lsg: source-gate spacing, Lg: gate length, Lgd: gate-drain spacing).

The schematic cross-section of the fabricated device for this embodiment is shown in FIG. 1. Cr/Pt was put down as the stepper alignment mark. Thereafter, mesa etching was performed in an ICP-RIE etcher using a chlorine-based gas mixture. Then, Ta/Ti/Al/Mo/Au ohmic metal stack was evaporated. After a rapid thermal annealing, on-chip transfer length measurements showed an ohmic contact transfer resistance of 0.6 Ω-mm and a sheet resistance of 390 Ω/square. Next, 15 nm of HfO2 was put down by atomic layer deposition (ALD). Afterwards, a Ti/Au metal stack was evaporated and lifted-off as the gate contact. Finally, a Si3N4 additional layer was put down by plasma-enhanced CVD, as an encapsulation layer, to prevent problems such as arcing due to environmental conditions. The source-gate spacing Lsg was fixed at 1.5 μm, and the gate length Lg was 1 μm. The gate width Wg was 125 μm×2. The gate-drain spacing Lgd was 10 μm. The source/drain contact lengths Ls/Ld were fixed at 7 μm.

Figure 2:
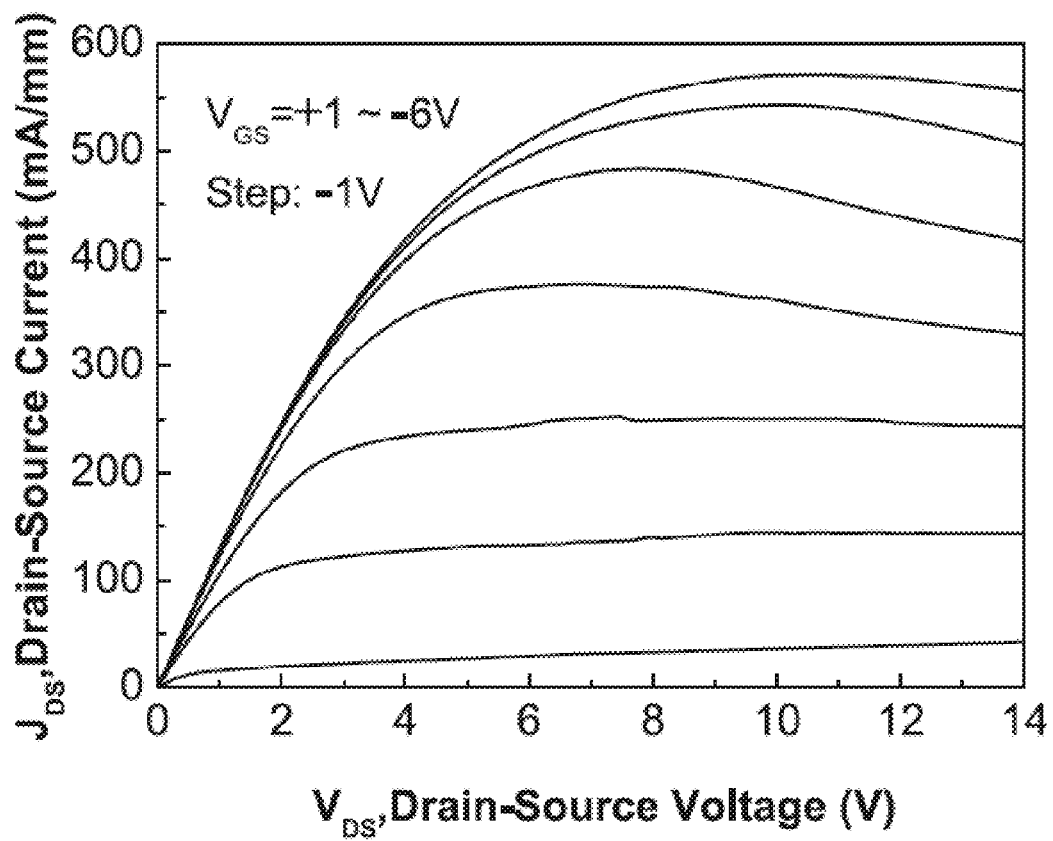
FIG. 2 shows the on-state DC characteristics of the fabricated HfO2 AlGaN/GaN MISHFETs. (JDS,max=575 mA/mm @ VGS=+1V, ARon=0.9 mΩ-cm2.) Transfer characteristics (not shown) showed gm,max=160 mS/mm, VT=−6V for the MISHFETs, and gm,max=182 mS/mm, VT=−4.5V for the HFETs, fabricated on the same wafer.

The on-state DC JDS-VDS curves, as shown in FIG. 2, were measured with a HP4142B modular source/monitor and microwave probes, with VGS swept from +1V to 6V with the step of −1V. The maximum current density JDS,max was 575 mA/mm. The negative slope of the on-state JDS-VDS characteristics was due to the heating effect, because of the low thermal conductivity of the sapphire substrate. The device active area A was defined by the mesa etching process, and it included both the source-to-drain region and the source/drain contact regions (A=(Ls+Lsg+Lg+Lgd+Ld)×Wg). The device on-resistance Ron was measured at JDS=JDS,max/2 of the on-state dc JDS-VDS curves at VGS=0V. The specific on-resistance ARon was defined as the product of Ron and A, which was measured to be 0.9 mΩ-cm2.

Transfer characteristics were measured at VDS of 5V. The peak transconductance gm,max of the MISHFET was 160 mS/mm, and the threshold voltage VT was −6V. For comparison, the gm,max and VT for the HFET fabricated on the same wafer were 182 mS/mm and −4.5V, respectively. Because of the high dielectric constant (~21) of the HfO2, which translates to efficient gate modulation, compared to low dielectric constant insulators, the decrease in transconductance for the MISHFETs is below 15% and the increase in threshold voltage is small, as compared to the HFETs. It is also worth mentioning that the gate voltage swing increased ~20% for the MISHFETs, as compared to HFETs, suggesting a more linear behavior, and thus, lower nonlinear distortions in switching applications is obtained.

Pulsed I-V was performed to investigate the current slump aspect in the fabricated HfO2 MISHFETs, using a "return current" technique proposed and used in literature (see Refs. 10-12). A pulse generator, an oscilloscope, a DC power supply and a probe test station were used for the measurements. For these measurements, the drain-source bias was fixed constant at a value in the saturation regime (VDS=8V), which was commonly used to reveal current slump (see Refs. 10-12). The gate voltage was then pulsed at a frequency of 100 KHz with a 50% duty cycle. The gate voltage pulse amplitude varied from a negative value VGP up to 0V (open channel).

Figure 3:
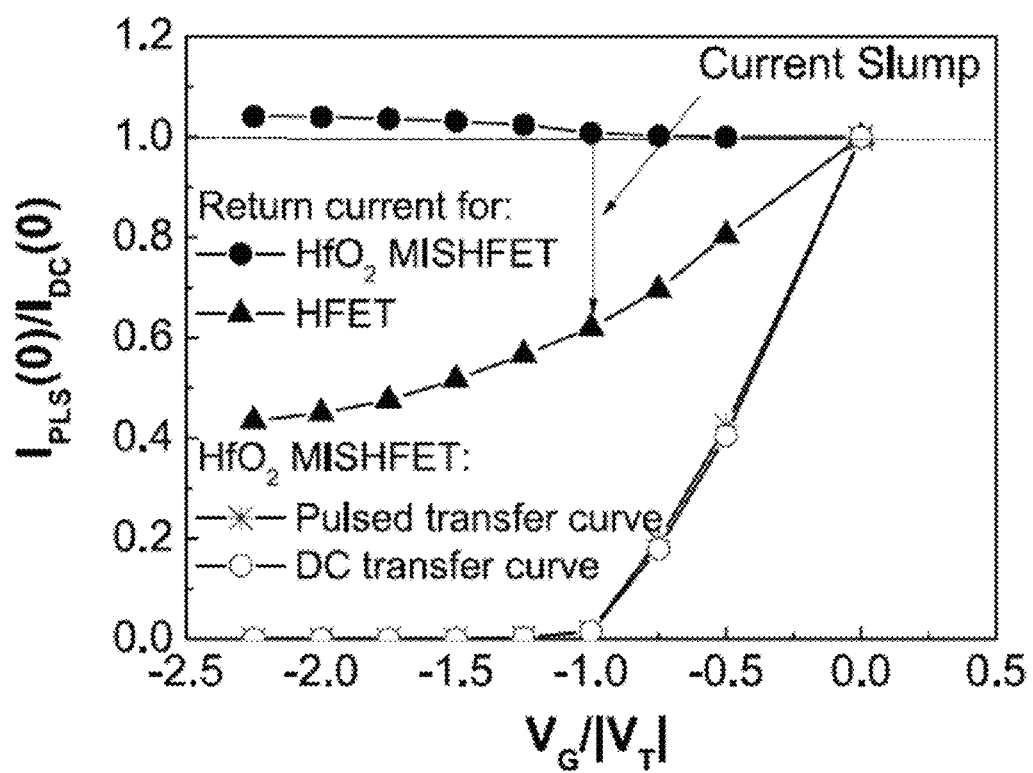
FIG. 3 shows a pulsed I-V characteristics of the HfO2 AlGaN/GaN MISHFETS and HFETs, fabricated on the same wafer. The pulse width is 10 μs, duty cycle 50%. The return current was measured immediately after gate pulse removal. A decrease in return current from DC value at zero gate bias IDS(0) is indicative of the current collapse.

The current measured immediately after the gate voltage returns to zero is referred to as the "return current" IPLS(0). For devices free of current slump, the return current for any value of VGP is equal to the steady state DC current at zero gate bias IDC(O), i.e. IPLS(0)/IDC(0)=1. The deviation of the "return current" from IDC(0) is a measure of the degree of current slump. The plot of the pulsed return current normalized to the dc current at zero gate bias versus the gate voltage normalized to the threshold voltage is shown in FIG. 3, for both the MISHFET and the HFET fabricated on the same chip.

For HFETs, the surface trap related current slump was clearly pronounced. However, for the MISHFET, the device current at negative gate pulse voltages returned to its dc value, indicating that the presence of HfO2 layer eliminated the current slump completely. It is also observed that the current increases slightly for the MISHFET, possibly due to the 50% reduction in heat generation under the pulse measurements. The pulsed and DC transfer curves for the HfO2 MISHFET were also shown in FIG. 3.

It is noted that the threshold voltages for the MISHFET are the same under the pulse and DC conditions. This suggests that the defect density at the interface between HfO2/AlGaN is very low at the applied frequency. The low interface defect density might be the main reason for the current slump suppression.

In the literature, there are many reports on the high breakdown voltages obtained from AlGaN/GaN FETs. However, limited by material quality and process technology, the breakdown voltages have been widely defined at a current level as high as 1 mA/mm. By this criterion, the off-state power consumption is too high at high operating voltages, making these devices (reported in the literature) not practical for real applications.

Figure 4:
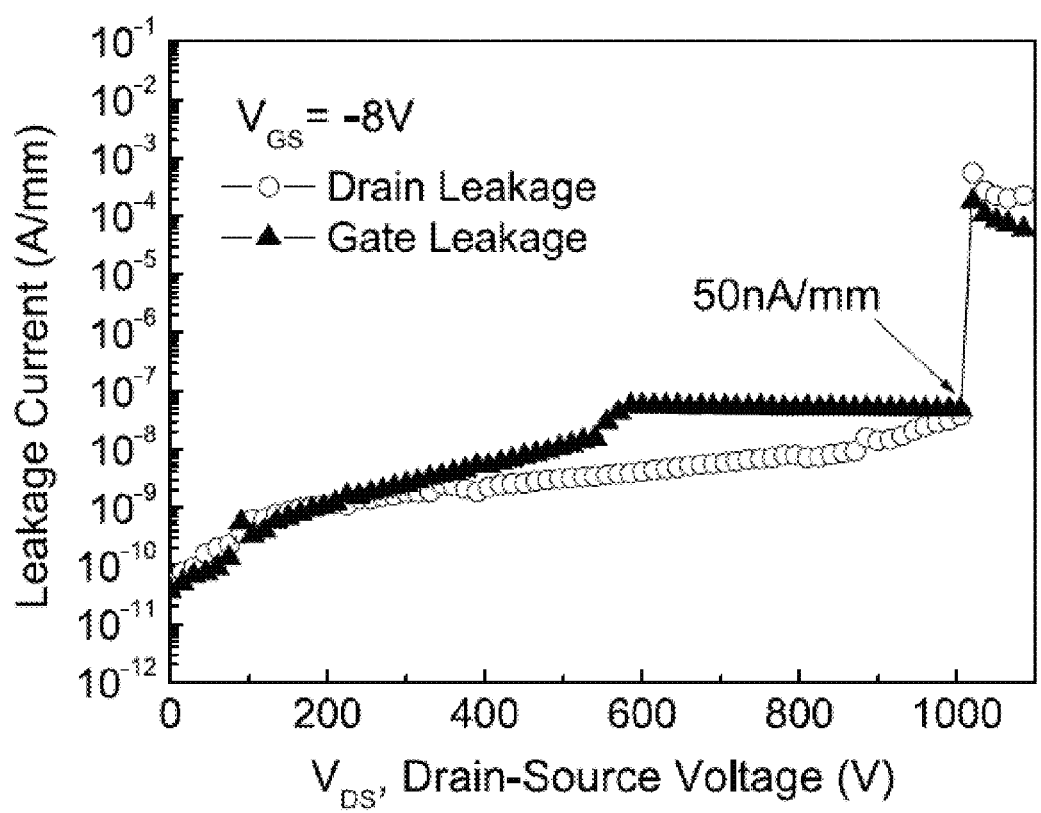
FIG. 4 shows the off-state breakdown characteristics of the fabricated HfO2 AlGaN/GaN MISHFETs (Lgd=10 μm). Gate and drain leakage currents right before breakdown at 1035V were 50 nA/mm.

By contrast, for our devices, for testing the current example, the off-state breakdown characteristics of the fabricated MISHFETs were measured using a Tektronix 370A curve tracer under VGS of −8V. Almost all the devices measured were biased to destruction. As shown in FIG. 4, the gate leakage and drain leakage currents right before the device breakdown were as low as 50 nA/mm. A hard breakdown at 1035V was repeatedly tested for the MISHFETs with gate-drain spacing of 10 μm, without any field plate design.

Figure 5:
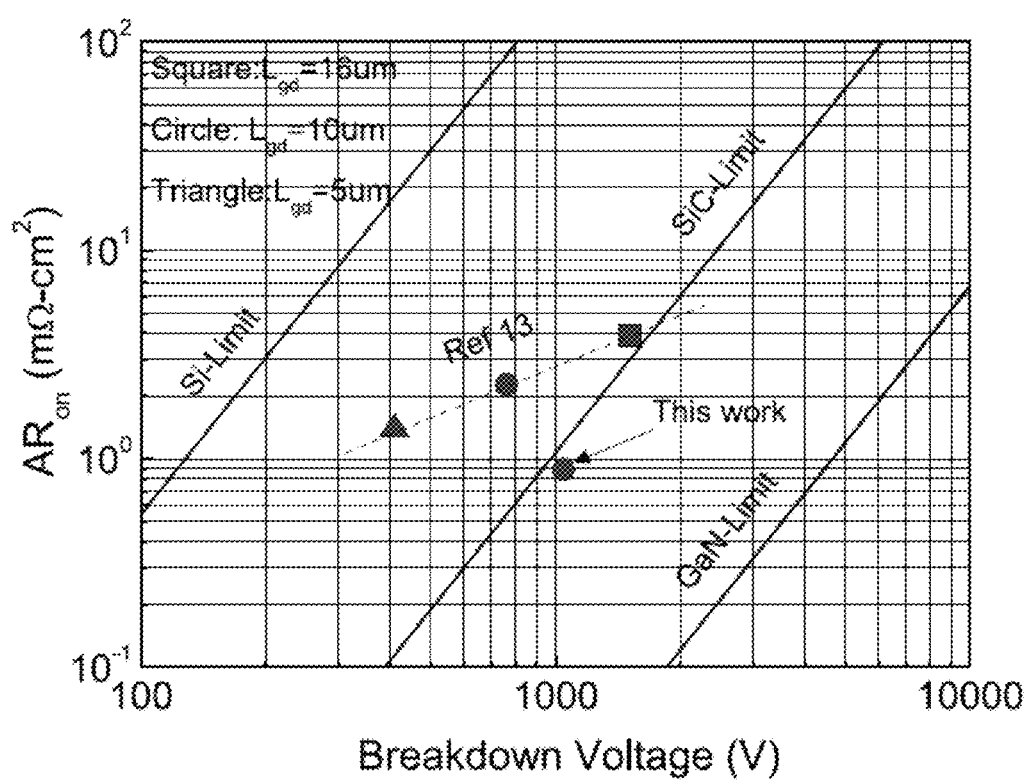
FIG. 5 shows the relations between specific on-resistance (ARon) and breakdown voltage (BV) for the fabricated HfO2 AlGaN/GaN MISHFETs (Lgd=10 μm) on sapphire in this work and the fabricated HFETs from Ref 13 (of the same research group).

FIG. 5 presents the BV-ARon relations for the fabricated MISHFETs with Lgd=10 μm (together with some previous results from Ref 13, of the same research group, at Cornell Univ.). The performance of a BV of 1035V with an ARon of 0.9 mΩ-cm2 is the best ever reported for GaN-based FETs fabricated on sapphire substrate, to the best of our knowledge.

The power device figure of merit (BV2/ARon) was about 1.2×109 V2/(Ω-cm2). The complete elimination of current slump, as shown by the pulsed measurements, which simulate the normal device operation, and the significantly low leakage currents make the HfO2 MISHFETs an excellent candidate for high power and fast switching applications.

Figure 6A:
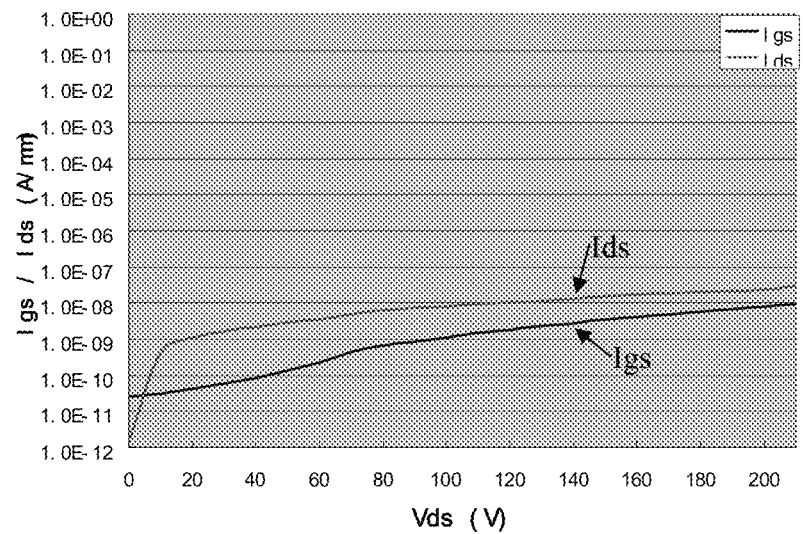
FIGS. 6a-b show the results of leakage current tests with buffered HF pre-treatments and without buffered HF pre-treatments, respectively, of the deposited HfO2 layer. Leakage currents were significantly reduced with the buffered HF pre-treatment of the deposited HfO2 layer.
Figure 6B:
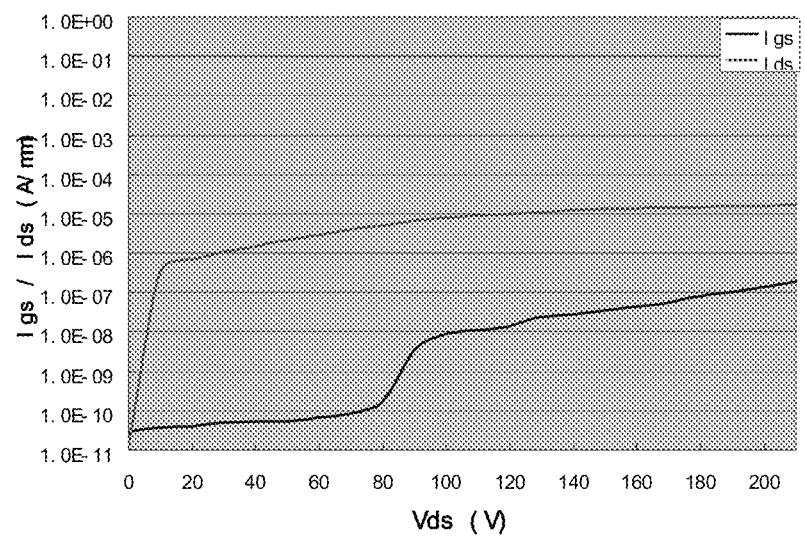

Pre-Treatment and/or Post-Treatment of the HfO2 Layer for Improved Performance:

Embodiments utilizing pre-treatment and post-treatment of the HfO2 layer have shown improved leakage current and breakdown voltage performance. FIGS. 6A and 6B illustrate the results of leakage current tests with buffered HF pre-treatments and without buffered HF pre-treatments, respectively, of the deposited HfO2 layer.

Figure 7A:
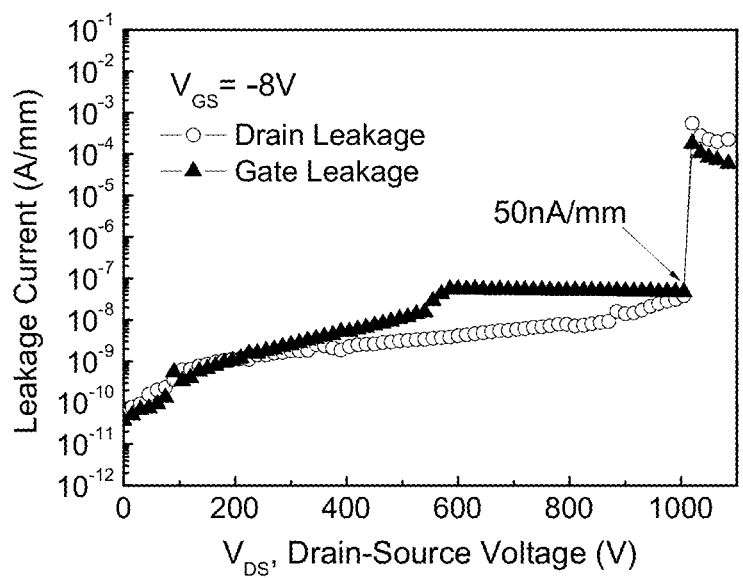
FIGS. 7a-b show the results of off-state breakdown tests with post-treatments and without post-treatments, respectively, of the HfO2 layer. With post-treatments, the breakdown voltage was 1035V. Without post-treatments, the breakdown voltage was 720V.
Figure 7B:
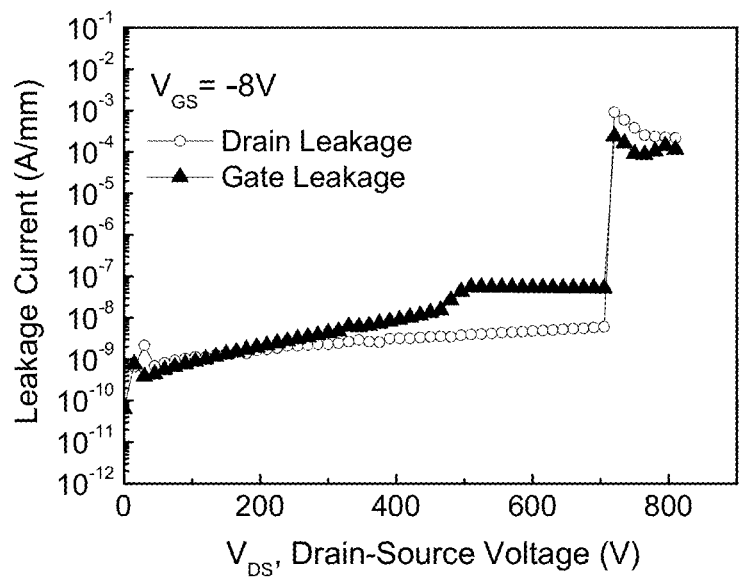

Leakage currents were significantly reduced with the buffered HF pre-treatment of the deposited HfO2 layer. Similarly, FIGS. 7A and 7B illustrate the results of off-state breakdown tests with post-treatments and without post-treatments, respectively, of the HfO2 layer. With post-treatments, the breakdown voltage was 1035V. Without post-treatments, the breakdown voltage was 720V.

In this embodiment, device fabrication started with a mesa etching for device isolation after the formation of the alignment mark on the chip. This was done in a chlorine based gas mixture for several minutes depending on the specific conditions (for example: BCl3/Cl2/Ar under 10 to 15 mTorr of pressure and having RIE power of 40 W with a DC bias in the range of 100 to 120 V, ICP power about 400 W, for 1 to 2 minutes). Then, the ohmic openings were defined by photolithography.

A. Basu et. al. has developed an ohmic metal layer stack with SiCl4 plasma treatment annealed at low temperature (500 C), as referenced in J. Vac. Sci. Technol. B 24, L16-L18 (2006), using a Mo/Al/Mo/Au metal stack.

Prior to the ohmic metal evaporation, a plasma treatment was conducted. This plasma treatment can be done in any plasma etching tools. The chemical used was SiCl4, with a flow rate of about 20 to 30 sccm, and the pressure was in the range from 20 mTorr to 30 mTorr. The RIE power used was in the range of 130 to 170 W. The treatment time was from 1 to 2 minutes.

After the plasma treatment, the chips were immediately transferred to an evaporator for ohmic metal deposition. Because of the presence of the AlN interbarrier layer, a Ta/Ti/Al/Mo/Au metal layer scheme was used. The Ta thickness can vary from 70 to 150 Å, Ti thickness can be about 150 Å, Al about 900 Å, Mo about 450 Å, and Au about 500 Å.

Thereafter, the chips were annealed in N2 at 500 to 600 C for about 1 to 3 minutes. On-chip transfer length method was used to check the contact resistance and sheet resistance. There is no degradation in channel conductance observed. In this embodiment, buffered HF pre-treatment of the semiconductor surface occurred prior to the dielectric (HfO2) atomic layer deposition, when the wafer surface was cleaned by buffered HF and/or HCl for about 0.5 to 2 minutes.

The temperature for the HfO2 dielectric deposition can vary from 100 to 400 C, and the recommended range is from 200 to 300 C. However, other similar temperatures ranges work substantially the same, with similar results. The thickness of the dielectric can be in the range of 50 to 200 Å. Afterwards, the dielectric layer was annealed (post-treatment of the HfO2 layer) at a temperature in the range of 300 to 450 C for 20 to 45 minutes.

Alternatively, the post-treatment of the HfO2 layer could be treated by remote F and H containing plasma. The post-treatment may occur in the environment of gas sources, such as H2, NH3, O2, N2, or a combination thereof. Then, an additional Si3N4 encapsulation layer of the thickness 1000 to 1500 Å was put down by plasma enhanced chemical vapor deposition. This encapsulation layer can be Si3N4, SiO2, HfO2, Al2O3, or other similar material.

The temperature of deposition can vary in the range of 250 to 400 C. Afterwards, the gate opening was defined by photolithography, and the encapsulation layer was dry etched using CHF3/O2 gas mixture, and Ti/Au metal stack was deposited as the gate. Alternatively, the gate layer deposition can be prior to the encapsulation layer deposition. The fabricated device in this embodiment has a low specific on-resistance of 0.9 mΩ-cm2, and a high breakdown voltage of 1035V for a gate-drain spacing (Lgd) of 10 μm, without the employment of any field plates.

The gate and drain leakage currents before the hard breakdown are as low as about 50 nA/mm, and no current slump/dispersion was observed under pulse current-voltage measurements.

In summary, in one embodiment, we have produced, designed, and invented some MISHFETs, such as AlGaN/GaN MISHFET's, using HfO2 as passivation and gate dielectric. In addition to being substantially current slump-free, and having significantly low leakage currents, until right before a hard breakdown, the MISHFETs exhibit excellent device performance of 0.9 mΩ-cm2 specific on-resistance with 1035V breakdown voltage for gate-drain spacing of 10 μm, without any field plate design.

This embodiment provides transistors which can maintain high blocking voltages, of over 1000 Volts and greater, with ultra low leakage currents, on the order of 50 nA/mm, while simultaneously exhibiting on-resistance of lower than 1 mΩ-cm2, and demonstrating minimized current slump/dispersion under pulsed current-voltage measurements.

These characteristics are particularly advantageous for power switching applications. By comparison, RF switches may be used to switch on-and-off relatively low power microwave or radio-frequency signals. Generally speaking, the switching rate on RF switches is not fast, and the switching voltage is not high.

By contrast, one of the embodiments of our invention provides a device capable of high current, high voltage, high power, and fast switching in the range of tens to hundreds of MHz at low duty cycle. It allows efficient power conditioning, when used in such applications.

For one embodiment, we have a power switching heterojunction transistor comprising a passivation layer of HfO2. For one embodiment, we have a power switching heterojunction transistor, wherein the passivation layer is amorphous. For one embodiment, we have a method of manufacturing a power switching heterojunction transistor, comprising: pre-treating for the HfO2 passivation layer, forming the HfO2 passivation layer; and post-treating the HfO2 passivation layer.

For one embodiment, we have a method of obtaining low ohmic contact resistance. For one embodiment, we have a method of oxide treatment. For one embodiment, we have a method of improving leakage current and breakdown voltage.

Note that FIGS. 2-7 demonstrate the unexpected results and synergies from the embodiments of the current invention, for the superior and record-breaking device results, as being non-obvious with respect to all prior art or combination thereof.

Having thus described several embodiments of a high performance and fast power switch, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and the scope of the claimed invention.

Although specific setpoints and ranges may have been disclosed herein for the embodiments described, other embodiments may utilize other setpoints, dimensions, and ranges while still falling within the scope of the claimed invention. The method or process steps described in the disclosed embodiments are just examples. There may be many variations to the process steps or (or operations) described herein without departing from the spirit of the invention.

For instance, the steps may be performed in a differing order, or steps may be added, deleted, or modified. All of these variations are considered as a part of the claimed invention. Additionally, the recited order of the processing elements or sequences, or the use of numbers, letters, or other designations, is not intended to limit the claimed processes to any order except as may be specified in the claims. Accordingly, the claimed invention is limited only by the following claims and equivalents thereto. Any variations of the above teaching are also intended to be covered by this patent application.

The invention claimed is:

1. A field-effect transistor device, said field-effect transistor device comprising:
   a first semiconductor layer;
   a second semiconductor layer;
   a passivation layer of HfO2 or any variation of Hafnium and Oxide compound;
   wherein said field-effect transistor device is pre-treated by buffered HF before deposition of said passivation layer;
   wherein said field-effect transistor device is post-treated by annealing in range of 300 to 450 C for 20 to 45 minutes after deposition of said passivation layer;
   wherein said field-effect transistor device is post-treated by remote F and H containing plasma after deposition of said passivation layer;
   wherein said field-effect transistor device is post-treated by gas source selected from H2, NH3, O2, or N2, after deposition of said passivation layer; and
   an encapsulation layer comprising Si3N4, SiO2, HfO2, or Al2O3, deposited after said passivation layer, using plasma enhanced chemical vapor deposition.

2. A method of producing or fabricating a field-effect transistor device, said method comprising the steps of:
   depositing a first semiconductor layer;
   depositing a second semiconductor layer;
   pre-treating said field-effect transistor device by buffered HF before deposition of a passivation layer of HfO2 or any variation of Hafnium and Oxide compound;
   depositing said passivation layer;
   post-treating said field-effect transistor device by annealing in range of 300 to 450 C for 20 to 45 minutes after said deposition of said passivation layer;
   post-treating said field-effect transistor device by remote F and H containing plasma after said deposition of said passivation layer;
   post-treating said field-effect transistor device by gas source selected from H2, NH3, O2, or N2, after said deposition of said passivation layer; and
   depositing an encapsulation layer comprising Si3N4, SiO2, HfO2, or Al2O3, after said passivation layer, using plasma enhanced chemical vapor deposition.

3. The field-effect transistor device as recited in claim 1, wherein said field-effect transistor device comprises a heterojunction interface.

4. The field-effect transistor device as recited in claim 1, wherein said field-effect transistor device is a power switching transistor.

5. The field-effect transistor device as recited in claim 1, wherein said field-effect transistor device is an AlGaN/GaN transistor.

6. The field-effect transistor device as recited in claim 1, wherein said passivation layer is amorphous.

7. The field-effect transistor device as recited in claim 1, wherein said field-effect transistor device comprises one or more III-V compound layers.

8. The field-effect transistor device as recited in claim 1, wherein said field-effect transistor device comprises one or more amorphous, polycrystalline, or crystalline layers.

9. The field-effect transistor device as recited in claim 1, wherein said field-effect transistor device comprises one or more pseudomorphic layers.

10. The field-effect transistor device as recited in claim 1, wherein said field-effect transistor device comprises one or more metal layers.

11. The field-effect transistor device as recited in claim 1, wherein said field-effect transistor device comprises one or more semi-insulating, insulating, or oxide layers.

12. The field-effect transistor device as recited in claim 1, wherein said field-effect transistor device is a metal-insulator-semiconductor heterostructure field-effect transistor.

13. The field-effect transistor device as recited in claim 1, wherein said field-effect transistor device comprises a gate insulation.

14. The field-effect transistor device as recited in claim 1, wherein said field-effect transistor device is produced or fabricated on a substrate, selected from one or more of the following: silicon carbide, silicon, sapphire, zinc oxide, quartz, fused silicon, silicon, ceramic substrate, or free-standing GaN.

15. The field-effect transistor device as recited in claim 1, wherein said field-effect transistor device comprises MN interbarrier layer.

16. The field-effect transistor device as recited in claim 1, wherein said field-effect transistor device comprises a Mo/Al/Mo/Au metal stack.

* * * * *